United States Patent
Lee et al.

(10) Patent No.: US 8,349,651 B2
(45) Date of Patent: Jan. 8, 2013

(54) STACKED PACKAGE AND METHOD OF MANUFACTURING THE SAME

(75) Inventors: Won-Hwa Lee, Seoul (KR); Seok-chan Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/219,812

(22) Filed: Aug. 29, 2011

(65) Prior Publication Data

US 2011/0312130 A1    Dec. 22, 2011

Related U.S. Application Data

(62) Division of application No. 12/149,601, filed on May 5, 2008, now Pat. No. 8,030,747.

(30) Foreign Application Priority Data

Oct. 30, 2007    (KR) .................. 10-2007-0109700

(51) Int. Cl.
*H01L 21/00* (2006.01)
(52) U.S. Cl. ...................... 438/107; 438/110
(58) Field of Classification Search .......... 438/106, 438/107, 109, 110
See application file for complete search history.

(56) References Cited

U.S. PATENT DOCUMENTS

| | | | |
|---|---|---|---|
| 6,031,281 A | 2/2000 | Kang et al. | |
| 6,316,838 B1 | 11/2001 | Ozawa et al. | |
| 6,476,467 B2 | 11/2002 | Nakamura et al. | |
| 6,838,766 B2* | 1/2005 | Inoue et al. | 257/724 |
| 7,166,924 B2* | 1/2007 | Lu et al. | 257/777 |
| 7,239,164 B2 | 7/2007 | Tamaki | |
| 7,569,922 B2 | 8/2009 | Ogata | |
| 2007/0278646 A1* | 12/2007 | Ogata | 257/686 |
| 2008/0197509 A1 | 8/2008 | Yamaguchi et al. | |
| 2009/0045497 A1 | 2/2009 | Kagaya et al. | |
| 2011/0089575 A1* | 4/2011 | Lee | 257/777 |
| 2012/0080806 A1* | 4/2012 | Song et al. | 257/777 |

FOREIGN PATENT DOCUMENTS

| KR | 10-2002-0015215 | 2/2002 |
|---|---|---|
| KR | 10-0583491 | 5/2006 |

OTHER PUBLICATIONS

English Language Abstract of KR 10-2001-0094894 dated Nov. 3, 2001.

* cited by examiner

*Primary Examiner* — S. V. Clark
(74) *Attorney, Agent, or Firm* — Harness, Dickey & Pierce

(57) ABSTRACT

In one embodiment, the stacked package includes a first chip disposed over a package substrate. The first chip has at least one first chip dummy pad, and the first chip dummy pad is not electrically connected to circuits of the first chip. A first dummy bonding wire is connected to the first chip dummy pad and the package substrate. A second chip is disposed over at least a portion of the first chip, and the second chip has at least one second chip bonding pad. A first bonding wire is electrically connected to the second chip bonding pad and the first dummy bonding wire.

14 Claims, 18 Drawing Sheets

STACKED PACKAGE AND METHOD OF MANUFACTURING THE SAME

PRIORITY INFORMATION

This application is a divisional of U.S. application Ser. No. 12/149,601 filed May 5, 2008 now U.S. Pat. No. 8,030,747, which claims priority under 35 U.S.C. 119 on Korean Application No. 10-2007-0109700 filed Oct. 30, 2007; the entire contents of which are hereby incorporated by reference.

BACKGROUND

Due to the proliferation of high integration and portable electronic devices, semiconductor packaging technology with improved electrical capabilities, reduced cost, lighter weight, and slimmer profiles are in demand. To satisfy these technical needs, package on package (POP), chip scale packaging (CSP), and wafer-level packaging (WLP) have recently been introduced.

Many electronic applications require a set of integrated circuit chips that are packaged together on a common printed circuit board (PCB). For example, many applications call for a processor and some type of memory or different types of memory, such as volatile memory and non-volatile memory, to be included on the same PCB. If economies of scale dictate, it is sometimes more cost effective to package these integrated circuits together into a single multi-chip package (MCP), that allows tight integration of the devices and occupies less PCB space. System-in-package (SIP) is a technology which may allow a single integrated package of different kinds of electronic devices. SIP may offer increases in the performance and function of semiconductor devices while decreasing their size and/or cost.

SUMMARY OF THE INVENTION

The present invention relates to a stacked package.

In one embodiment, the stacked package includes a first chip disposed over a package substrate. The first chip has at least one first chip dummy pad, and the first chip dummy pad is not electrically connected to circuits of the first chip. A first dummy bonding wire is connected to the first chip dummy pad and the package substrate. A second chip is disposed over at least a portion of the first chip, and the second chip has at least one second chip bonding pad. A first bonding wire is electrically connected to the second chip bonding pad and the first dummy bonding wire.

In an embodiment, at least one first chip bonding pad is formed on the first chip. The first chip bonding pad is electrically connected to circuits of the first chip. A second bonding wire may be electrically connected to the first chip bonding pad and the package substrate.

In one embodiment, the first chip dummy pad and the first chip bonding pad are formed on a same surface of the first chip along a same edge of the first chip.

In another embodiment, the first chip bonding pad is formed on a first surface of the first chip, and the first chip dummy pad is formed on a second surface of the first chip, the second surface being opposite the first surface.

In a further embodiment, the first chip bonding pad is formed along a first edge of a surface of the first chip, and the first chip dummy pad is formed along a second edge of the surface of the first chip, the second edge being opposite the first edge.

In a still further embodiment, the first chip includes at least one first chip bonding pad and an associated conductive via. The conductive via is electrically connected to a first chip bonding pad and the package substrate.

The first chip may have a greater area than the second chip, or the second chip may have a greater area than the first chip.

An additional embodiment further includes a third chip disposed over the package substrate adjacent to the first chip such that the second chip is disposed over at least a portion of the first chip and over at least a portion of the third chip. The third chip has at least one third chip dummy pad. A second dummy bonding wire is connected to the third chip dummy pad and the package substrate. The second chip has more than one second chip bonding pad. The first bonding wire is electrically connected to one of the second chip bonding pads and the first dummy bonding wire. A second bonding wire is electrically connected to one of the second chip bonding pads and the second dummy bonding wire.

Yet another embodiment further includes a third chip disposed over the second chip. The third chip has a third chip bonding pad. The first chip has more than one first chip dummy bonding pad. The first dummy bonding wire is connected to one of the first chip dummy pads and the package substrate. A second dummy bonding wire is connected to another of the first chip dummy pads and the package substrate. The second chip has at least one second chip dummy bonding pad. A third dummy bonding wire is connected to the second chip dummy bonding pad and the second dummy bonding wire. A second bonding wire is electrically connected to the third chip bonding pad and the third dummy bonding wire.

In one embodiment, a connection pad is connected to the first dummy bonding wire, and the first bonding wire is electrically connected to the connection pad.

In an embodiment, an interposing member is disposed between the first and second chips. The interposing member is connected to the first bonding wire and the first dummy bonding wire, and electrically connects the first bonding wire and the first dummy bonding wire.

Yet another embodiment of the stacked package includes a first chip disposed over a package substrate. The first chip has at least one first chip dummy pad, and the first chip dummy pad is not electrically connected to circuits of the first chip. A first dummy bonding wire part is connected to the first chip dummy pad, and a second dummy bonding wire part is connected to the package substrate. A second chip is disposed over at least a portion of the first chip, and the second chip has at least one second chip bonding pad. A first bonding wire is electrically connected to the second chip bonding pad and the second dummy bonding wire part.

The present invention is also related to a method of fabricating a stacked package.

In one embodiment, the method includes disposing a first chip over a package substrate. The first chip has at least one first chip dummy pad, and the first chip dummy pad is not electrically connected to circuits of the first chip. This embodiment further includes forming a first dummy bonding wire connected to the first chip dummy pad and the package substrate, and disposing a second chip over at least a portion of the first chip. The second chip has at least one second chip bonding pad. A first bonding wire is electrically connected to the second chip bonding pad and the first dummy bonding wire.

In one embodiment, before the disposing a second chip, the method includes forming a first protective layer over the first chip, and removing the first protective layer until at least a portion of the first dummy bonding wire is exposed. The forming a first bonding wire electrically connects the first bonding wire to the exposed portion of the first dummy bonding wire.

Yet another embodiment includes forming a connection pad on the exposed portion of the first dummy bonding wire, and the forming a first bonding wire electrically connects the first bonding wire to the connection pad.

In another embodiment, before the disposing a second chip, the method includes forming a first protective layer over the first chip, forming a recess in the first protective layer to expose at least a portion of the first dummy bonding wire, and filling at least a portion of the recess with a connection pad. The forming a first bonding wire electrically connects the first bonding wire to the connection pad.

In still another embodiment, before the disposing a second chip, the method includes forming a first protective layer over the first chip, and removing the first protective layer until the first dummy bonding wire is separated into a first part and a second part. The first part is connected to the first chip dummy pad, and the second part is connected to the package substrate. The forming a first bonding wire electrically connects the first bonding wire to the second part. This embodiment may also includes forming a connection pad on the first protective layer and in contact with the second part, and the forming a first bonding wire electrically connects the first bonding wire to the connection pad.

The present invention further relates to applications of the stacked package.

In one embodiment, the stacked package is applied to a card. For example, the card includes a memory, and the memory includes a stacked package according to one of the above described embodiments. The card further includes a controller configured to control the memory.

In another embodiment, the stacked package is applied to a system. For example, the system includes bus, and a semiconductor device connected to the bus. The semiconductor device includes a stacked package according to any of the above described embodiments. The system also includes an input/output device connected to the bus, and a processor connected to the bus. The processor is configured to communicate with the input/output device and the semiconductor device via the bus.

BRIEF DESCRIPTION OF THE DRAWINGS

The present invention will become more fully understood from the detailed description given herein below and the accompanying drawings which are given by way of illustration only, wherein like reference numerals designate corresponding parts in the various drawings, and wherein.

DETAILED DESCRIPTION OF EXAMPLE EMBODIMENTS

Figure 1:
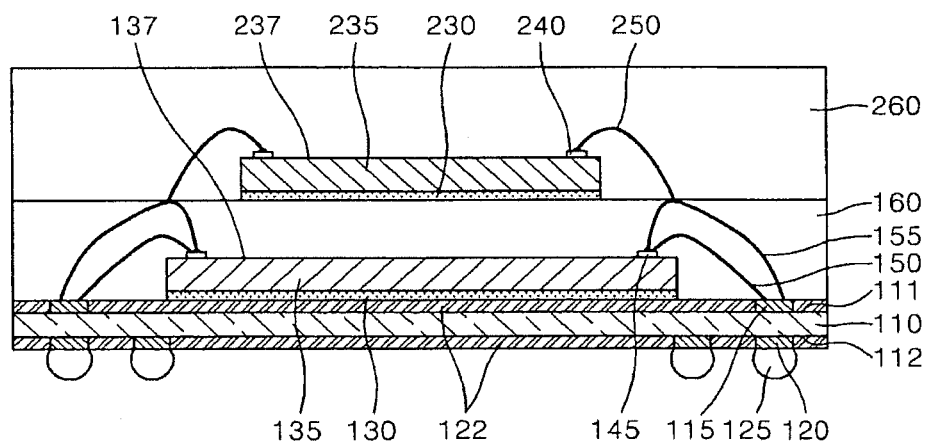
FIGS. 1 and 2 illustrate a stacked package according to a first embodiment of the present invention.

Example embodiments will now be described more fully with reference to the accompanying drawings. However, example embodiments may be embodied in many different forms and should not be construed as being limited to the example embodiments set forth herein. Example embodiments are provided so that this disclosure will be thorough, and will fully convey the scope to those who are skilled in the art. In some example embodiments, well-known processes, well-known device structures, and well-known technologies are not described in detail to avoid the unclear interpretation of the example embodiments. Throughout the specification, like reference numerals in the drawings denote like elements.

It will be understood that when an element or layer is referred to as being "on", "connected to" or "coupled to" another element or layer, it may be directly on, connected or coupled to the other element or layer, or intervening elements or layers may be present. In contrast, when an element is referred to as being "directly on," "directly connected to" or "directly coupled to" another element or layer, there may be no intervening elements or layers present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Thus, a first element, component, region, layer or section discussed below could be termed a second element, component, region, layer or section without departing from the teachings of the example embodiments.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting. As used herein, the singular forms "a", "an" and "the" may be intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
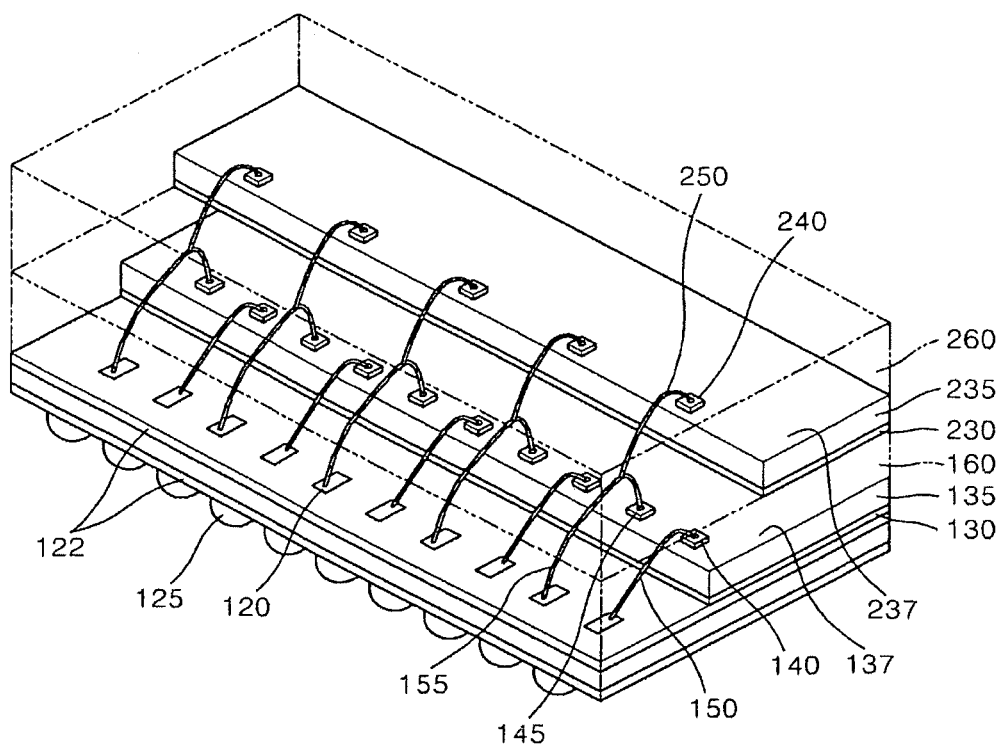

FIGS. 1 and 2 illustrate a stacked package according to a first embodiment of the present invention. FIG. 1 illustrates a side view of the stacked package, and FIG. 2 illustrates a perspective view of the stacked package. As shown in FIGS. 1 and 2, a first chip 135 is disposed over a package substrate 100. The package substrate 100 may include a substrate 110. The substrate 110 may be a PCB, etc. The first chip 135 may be a semiconductor chip such as a memory chip, ASIC, etc.

Bonding fingers 115 are formed on a first surface 111 of the substrate 110. The substrate 110 electrically connects at least a portion of the bonding fingers 115 with bump pads 120 formed on a second surface 112 of the substrate 110. Conductive bumps 125 are formed on the bump pads 120. Solder resist 122 is formed on the first and second surfaces 111 and 112 around the bonding fingers 115 and bump pads 120, respectively. The solder resist 122 may be an epoxy, silica, etc.

An adhesive layer 130 is formed over the package substrate 100 on the solder resist 122 on the first surface 111. The first chip 135 is disposed on the adhesive layer 130 to join the first chip 135 to the package substrate 100. The adhesive layer 130 may be an epoxy.

As shown in FIGS. 1 and 2, first bonding pads 140 and dummy bonding pads 145 are alternately formed along opposite edges of a surface 137 of the first chip 135. However, it will be appreciated that the first bonding pads 140 and the dummy bonding pads 145 may be alternately formed along only one edge of the surface 137. The first bonding pads 140 are electrically connected to circuits of the first chip 135, while the dummy bonding pads 145 are not electrically connected to circuits of the first chip 135.

As shown in FIG. 2, bonding wires 150 electrically connect respective bonding fingers 115 of the package substrate 100 with the first bonding pads 140, while dummy bonding wires 155 connect the dummy bonding pads 145 with other respective bonding fingers 115. The first bonding pads 140, dummy bonding pads 145, bonding wires 150 and dummy bonding wires 155 may include aluminum, copper, gold, etc.

As shown in FIG. 1, a first protective layer 160 is formed over the first chip 135 to cover and protect the first chip 135, the bonding wires 150 and the dummy bonding wires 155. However, as shown, at least a portion of the dummy bonding wires 155 are exposed by the first protective layer 160. In one embodiment, the first protective layer 160 is an epoxy layer such as an epoxy molding compound (EMC).

An adhesive layer 230 is formed on the first protective layer 160. A second chip 235 is disposed on the adhesive layer 230 to join the second chip 235 to the protective layer 160. The adhesive layer 230 may be an epoxy. As shown in FIGS. 1 and 2, second bonding pads 240 are formed along opposite edges of a surface 237 of the second chip 235. The second bonding pads 240 are electrically connected to circuits of the second chip 235.

As shown in FIG. 2, second bonding wires 250 electrically connect the second bonding pads 240 with the dummy bonding wires 155. In this manner, the second bonding wires 250 and the dummy bonding wires 155 electrically connect the second bonding pads 240 with the bonding fingers 115 of the package substrate 100. The second bonding pads 240 and second bonding wires 250 may include aluminum, copper, gold, etc.

As shown in FIG. 1, a second protective layer 260 is formed over the second chip 235 to cover and protect the second chip 235 and the bonding wires 250. In one embodiment, the second protective layer 260 is an epoxy layer such as an epoxy molding compound (EMC).

Figure 3:
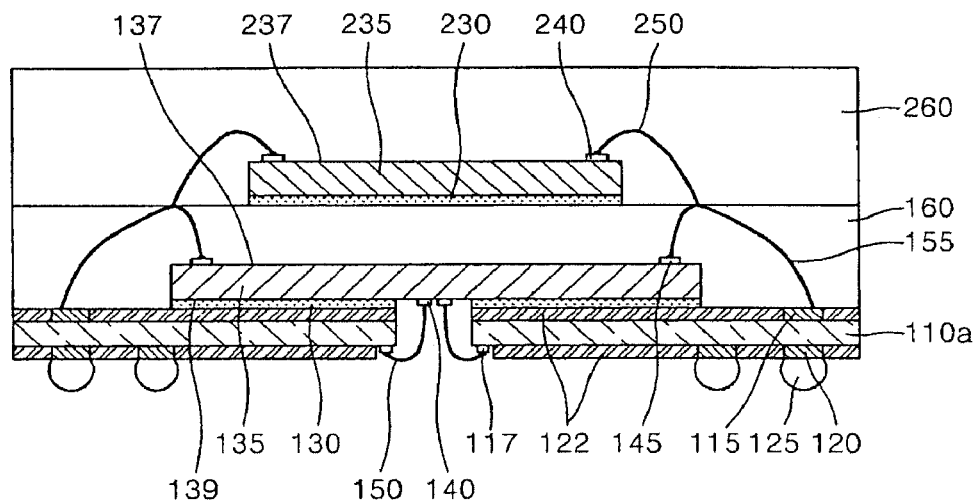
FIGS. 3-5 illustrate a stacked package according to a second embodiment of the present invention.
Figure 4:
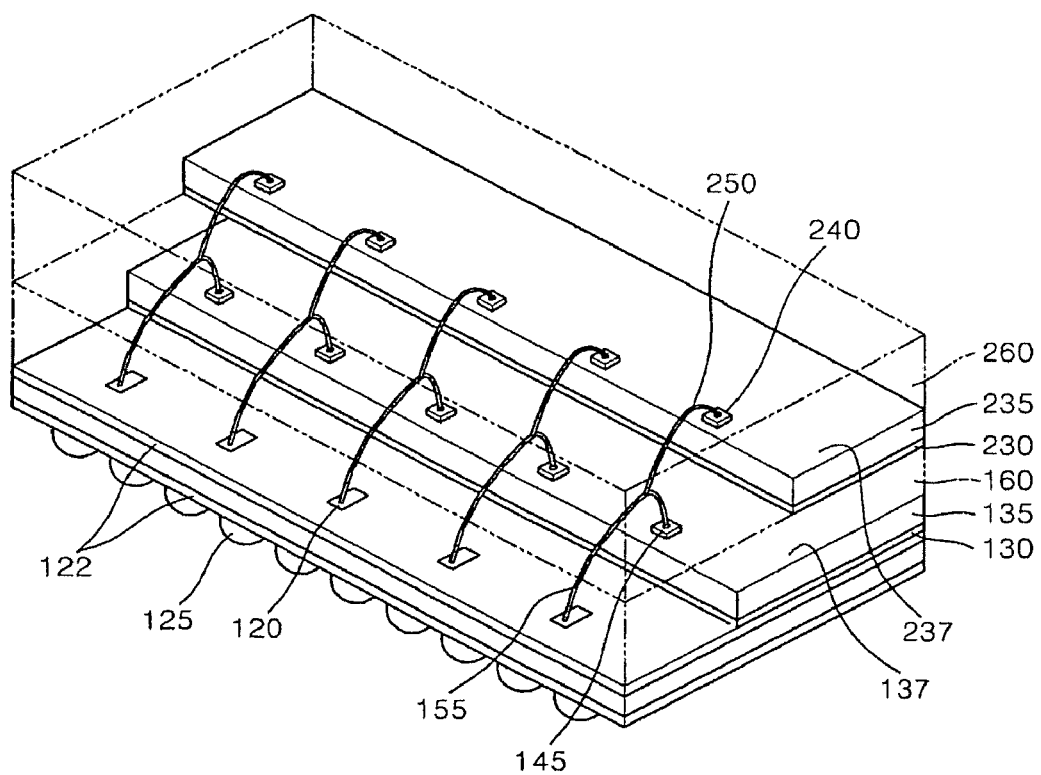
Figure 5:
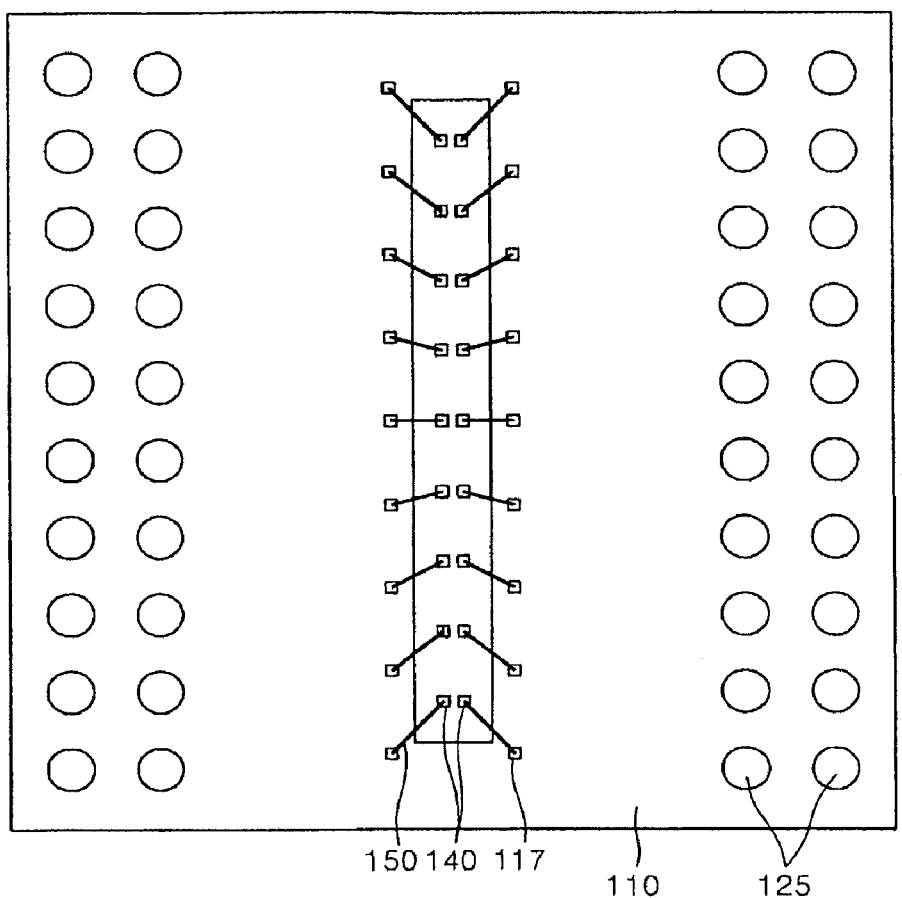

FIGS. 3-5 illustrate a stacked package according to a second embodiment of the present invention. As shown in FIG. 3, this second embodiment is similar to the first embodiment of FIGS. 1 and 2. For the sake of brevity, those aspects of this second embodiment that are the same as the first embodiment will not be described; and instead, the differences from the first embodiment will be described. As shown in FIG. 5, the first bonding pads 140 are not formed on the surface 137 of the first chip 135 as in the first embodiment. Instead, as shown in FIGS. 3 and 4 the first bonding pads 140 are formed on a surface 139 opposite the surface 137 of the first chip 135. In particular, as shown in FIG. 4, the first bonding pads are formed along a central portion or center line of the first chip 135. As shown in FIGS. 3 and 4, the bonding wires 150 electrically connect the first bonding pads 140 to bonding pads 117 on the substrate 110.

Figure 6:
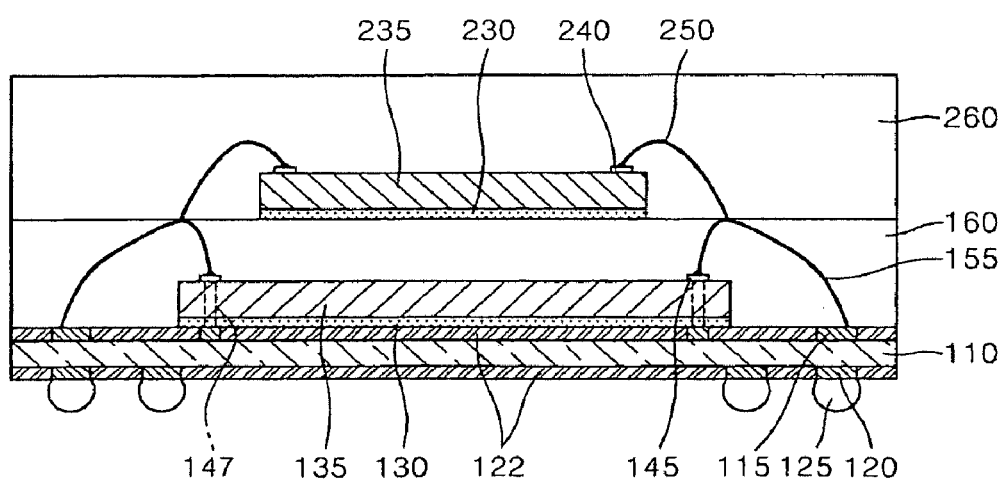
FIGS. 6-7 illustrate a stacked package according to a third embodiment of the present invention.
Figure 7:
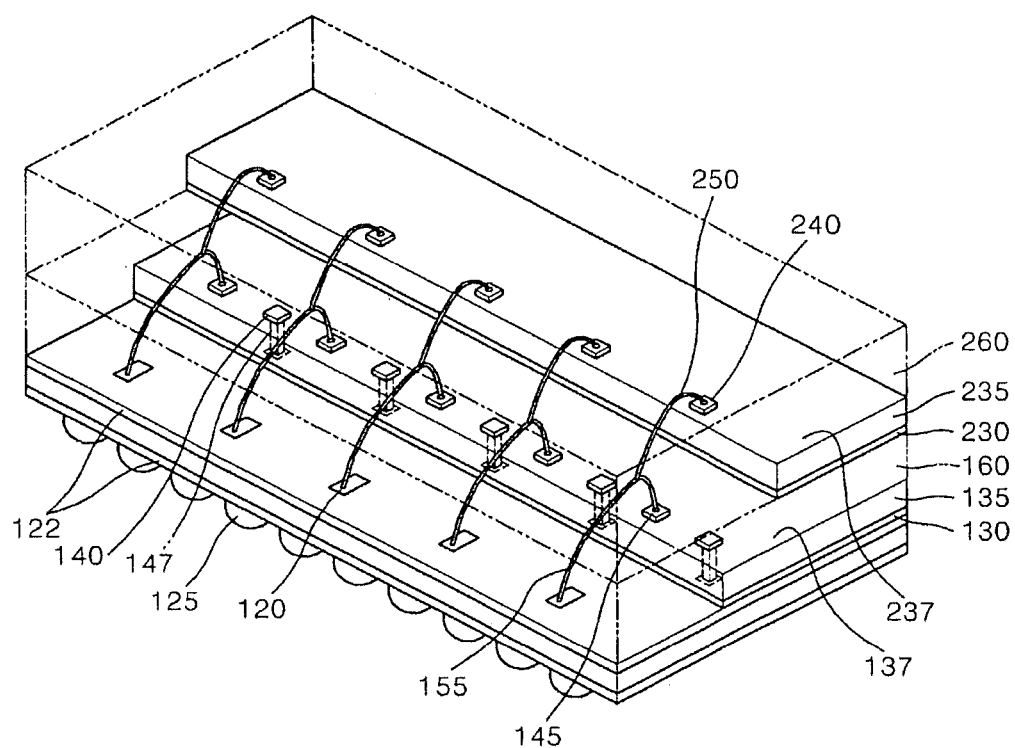

FIGS. 6-7 illustrate a stacked package according to a third embodiment of the present invention. As shown in FIGS. 6-7, this third embodiment is similar to the first embodiment of FIGS. 1 and 2. For the sake of brevity, those aspects of this third embodiment that are the same as the first embodiment will not be described; and instead, the differences from the first embodiment will be described. As shown in FIGS. 6-7, this embodiment does not include bonding wires 150 as in the first embodiment. Instead, vias 147 in the first chip 135 electrically connect the first bonding pads 140 to bonding fingers 115 of the package substrate 100. In one embodiment, the vias 147 may be through silicon vias (TSVs).

Figure 8:
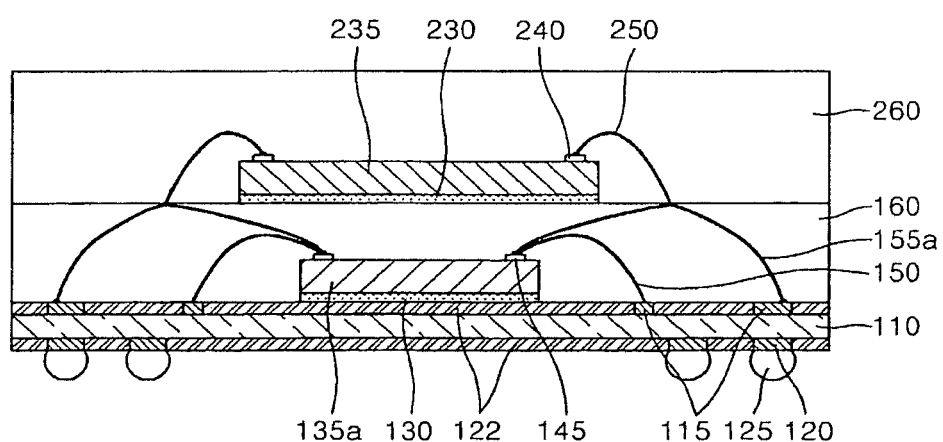
FIG. 8 illustrates a stacked package according to a fourth embodiment of the present invention.

FIG. 8 illustrates a stacked package according to a fourth embodiment of the present invention. As shown in FIG. 8, this fourth embodiment is similar to the first embodiment of FIGS. 1 and 2. For the sake of brevity, those aspects of this fourth embodiment that are the same as the first embodiment will not be described; and instead, the differences from the first embodiment will be described. As shown in FIGS. 1 and 2, the first chip 135 has a greater area than the second chip 235. However, in this fourth embodiment, the second chip 235 has a greater area than the first chip 135a. As a result, and as described in greater detail below regarding method embodiments of the present invention, the dummy bonding wires 155 may be formed by reverse wire bonding.

Figure 9:
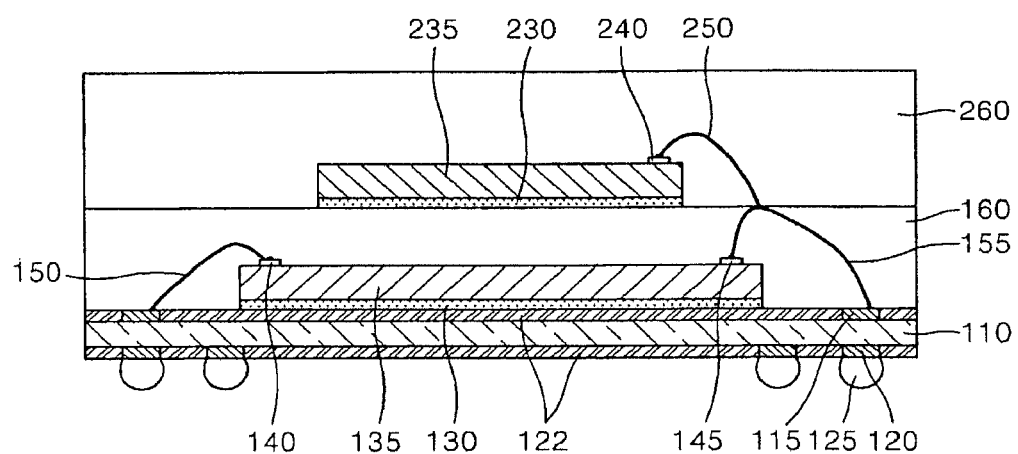
FIGS. 9-10 illustrate a stacked package according to a fifth embodiment of the present invention.
Figure 10:
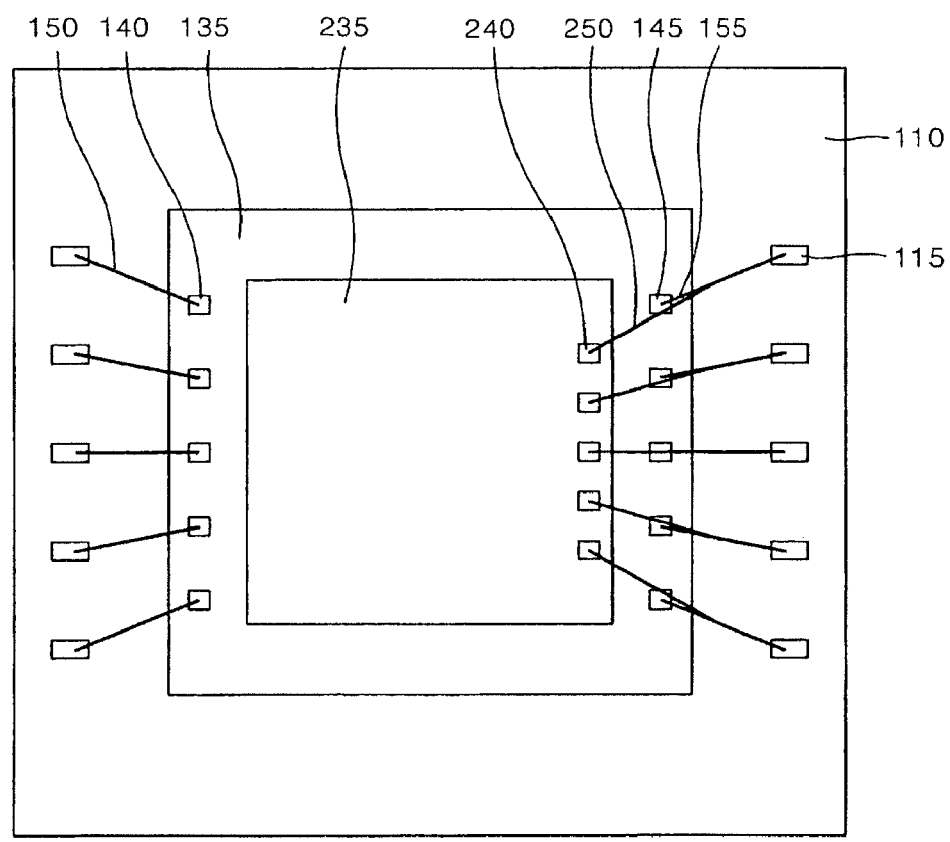

FIGS. 9-10 illustrate a stacked package according to a fifth embodiment of the present invention. As shown in FIGS. 9-10, this fifth embodiment is similar to the first embodiment of FIGS. 1 and 2. For the sake of brevity, those aspects of this fifth embodiment that are the same as the first embodiment will not be described; and instead, the differences from the first embodiment will be described. As shown in FIG. 10, the first bonding pads 140 are formed only along one side of the first chip 135 and the dummy bonding pads 145 are formed only along an opposite side of the first chip 135. In association therewith, the second bonding pads 240 are formed along only one side of the second chip 235 that corresponds to the side of the first chip 135 having the dummy bonding pads 145.

Figure 11:
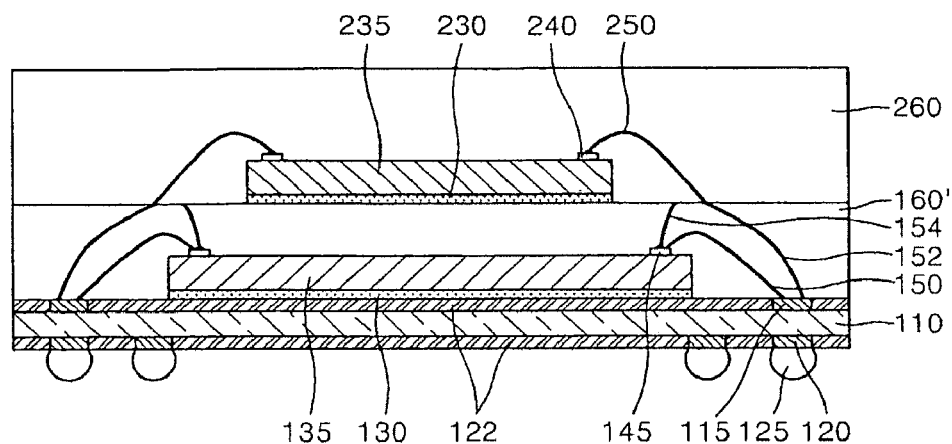
FIGS. 11-12 illustrate a stacked package according to a sixth embodiment of the present invention.
Figure 12:
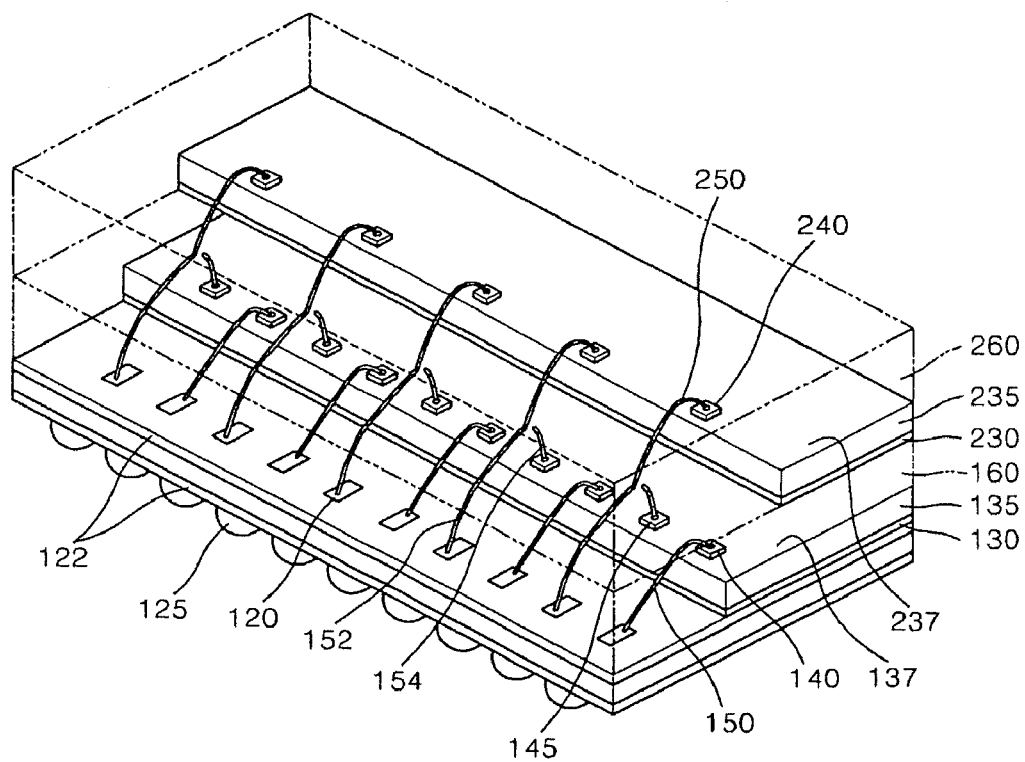

FIGS. 11-12 illustrate a stacked package according to a sixth embodiment of the present invention. As shown in FIGS. 11-12, this sixth embodiment is similar to the first embodiment of FIGS. 1 and 2. For the sake of brevity, those aspects of this sixth embodiment that are the same as the first embodiment will not be described; and instead, the differences from the first embodiment will be described. As shown in FIG. 11, the dummy bonding wires 150 have been separated into a first part 152 and a second part 154. As will be described with the respect to the method embodiments below, this occurs as a result of etching the protective layer 160 to form protective layer 160'. Accordingly, in this embodiment, the respective second parts 154 connect to the dummy bonding pads 145, and the respective first parts 152 connect to the package substrate 100. The second bonding wires 250 are electrically connected to the first parts 152.

Figure 13:
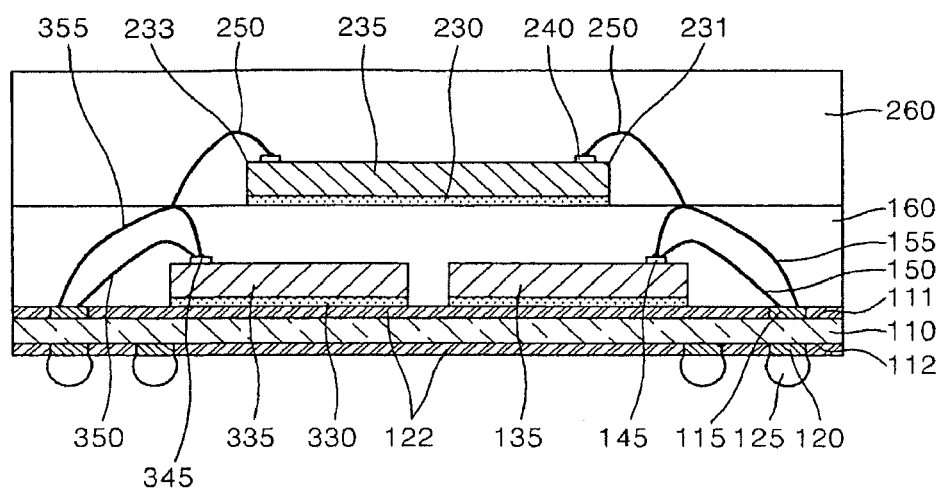
FIGS. 13-14 illustrate a stacked package according to a seventh embodiment of the present invention.
Figure 14:
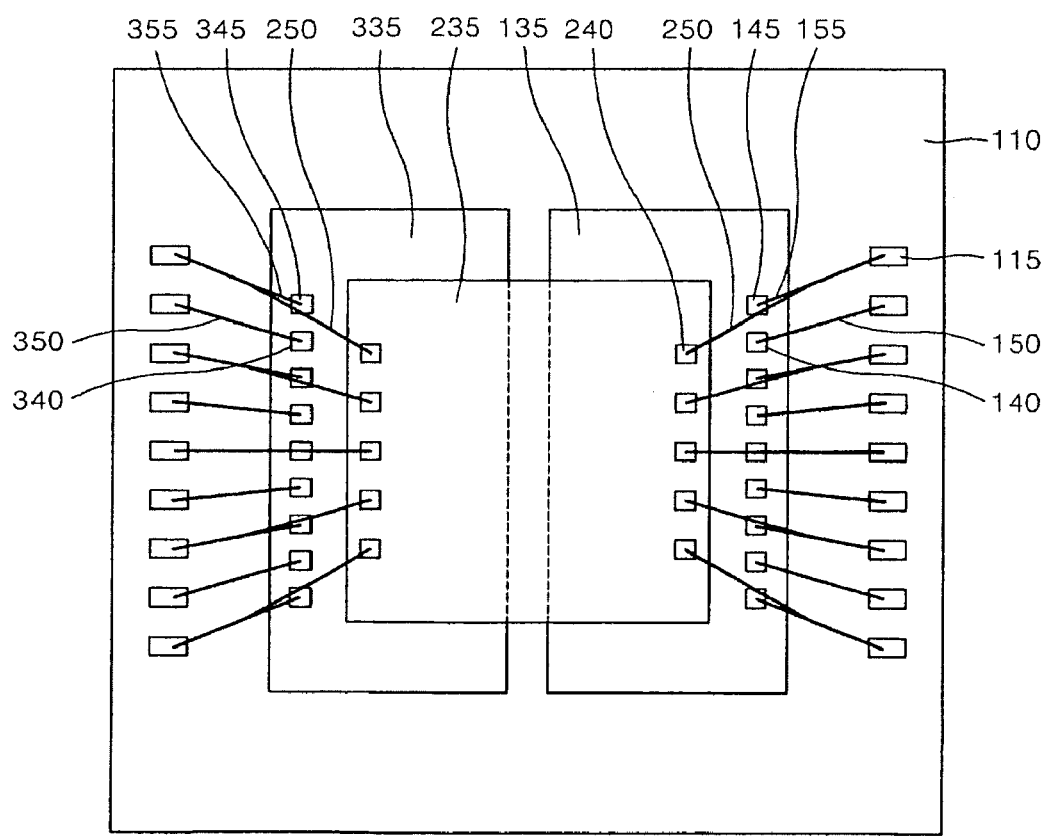

FIGS. 13-14 illustrate a stacked package according to a seventh embodiment of the present invention. As shown in FIGS. 13-14, this seventh embodiment is similar to the first embodiment of FIGS. 1 and 2. For the sake of brevity, those aspects of this seventh embodiment that are the same as the first embodiment will not be described; and instead, the differences from the first embodiment will be described. As shown in FIGS. 13-14, this embodiment includes a third chip 335 disposed over the package substrate 100 adjacent to the first chip 135. In particular, an adhesive layer 330 is formed on the package substrate 100, and the third chip 335 is disposed on the adhesive layer 330 to join the third chip to the package substrate 100.

The third chip 335 includes third bonding pads 340 and dummy bonding pads 345 alternately formed along one edge of the third chip 335. Third bonding wires 350 electrically connect the third bonding pads 340 to bonding fingers 115 of the package substrate 100. Dummy bonding wires 355 connect the dummy bonding pads 345 of the third chip 335 to bonding fingers 115 of the package substrate 100.

Similar to the third chip 335, the first chip 135 includes the first bonding pads 140 and the dummy bonding pads 145 formed alternately only along one edge of the first chip 135. In particular, the first chip 135 includes the first bonding pads 140 and the dummy bonding pads 145 on the edge further from the third chip 335, and the third chip 335 includes the third bonding pads 340 and the dummy bonding pads 345 on the edge further from the first chip 135.

The second chip 235 includes second bonding pads 240 disposed along a first edge 231 and along a second edge 233. Second bonding wires 250 electrically connect the second bonding pads 240 disposed along the first edge 231 to the dummy bonding wires 155. Second bonding wires 250 also electrically connect the second bonding pads 240 along the second edge 233 to the dummy bonding wires 355.

While in this embodiment, two chips 135 and 335 have shown and described as being disposed on the package substrate 100, it will be understood that more than two chips may be disposed on the package substrate 100 and have similar connections to the second chip 235.

Figure 15:
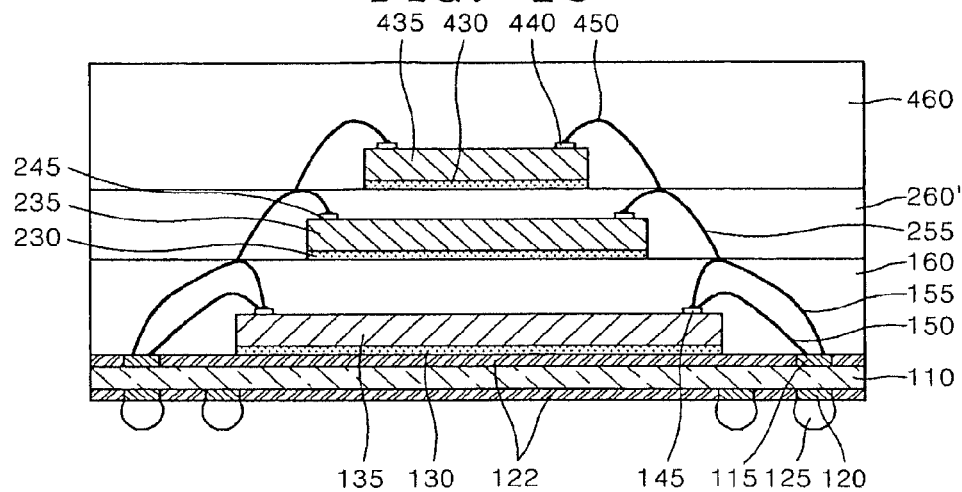
FIGS. 15-16 illustrate a stacked package according to an eighth embodiment of the present invention.
Figure 16:
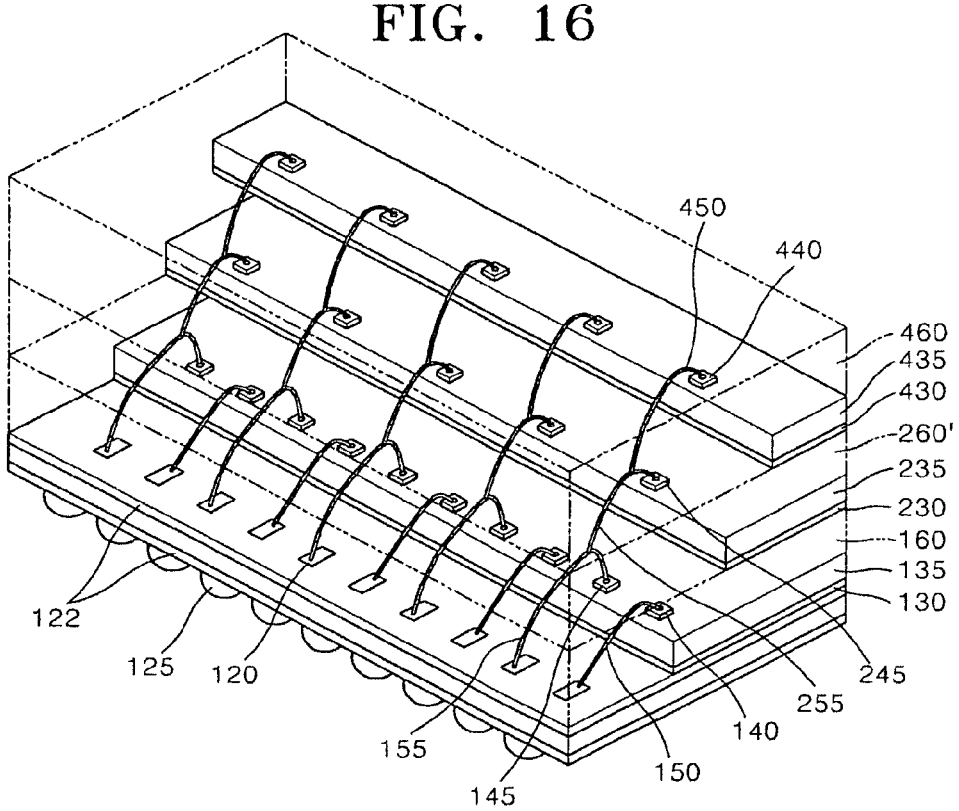

FIGS. 15-16 illustrate a stacked package according to an eighth embodiment of the present invention. As shown in FIGS. 15-16, this eighth embodiment is similar to the first embodiment of FIGS. 1 and 2. For the sake of brevity, those aspects of this eighth embodiment that are the same as the first embodiment will not be described; and instead, the differences from the first embodiment will be described. As shown in FIGS. 15 and 16, this embodiment includes a third chip 435 disposed over the second chip 235. In particular, an adhesive layer 430 is disposed on a second protective layer 260' over the second chip 235, and the third chip 435 is disposed on the adhesive layer 430. The adhesive layer 430 may be an epoxy.

In this embodiment, the second chip 235 may include second bonding pads 240 and second bonding wires 250 as shown in FIGS. 1-2, but those elements have not been shown in FIGS. 15 and 16 for the purposes of clarity. In this embodiment, as shown most clearly in FIG. 16, the second chip 235 may also include dummy bonding pads 245 and dummy bonding wires 255 connecting the dummy bonding pads 245 to the dummy bonding wires 155. The second dummy bonding pads 245 are not electrically connected to circuits of the second chip 235 as are the second bonding pads 240. Furthermore, the second protective layer 260' has been formed such that portions of the dummy bonding wires 255 are exposed.

The third chip 435 includes third bonding pads 440 that are electrically connected to circuits of the third chip 435. Bonding wires 450 connect the third bonding pads 440 to respective exposed portions of the dummy bonding wires 255. In this manner, the third bonding pads 440 may be electrically connected to the bonding fingers 115 of the substrate 110 via the bonding wires 450, the dummy bonding wires 255, and the dummy bonding wires 155. The second dummy bonding pads 245, the dummy bonding wires 255, the third bonding pads 440, and the bonding wires 450 may include aluminum, copper, gold, etc.

A third protective layer 460 is formed over the third chip 435 to protect and cover the third chip 435 and the bonding wires 450. The third protective layer 460 may be an epoxy layer such as an epoxy molding compound.

Figure 17:
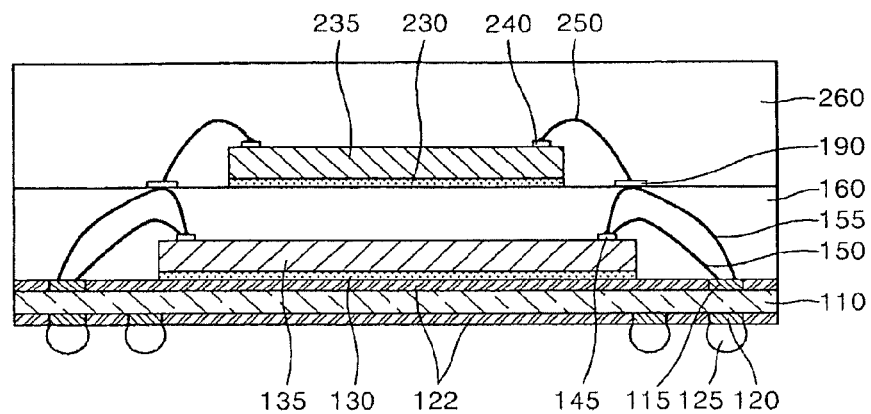
FIGS. 17-18 illustrate a stacked package according to an ninth embodiment of the present invention.
Figure 18:
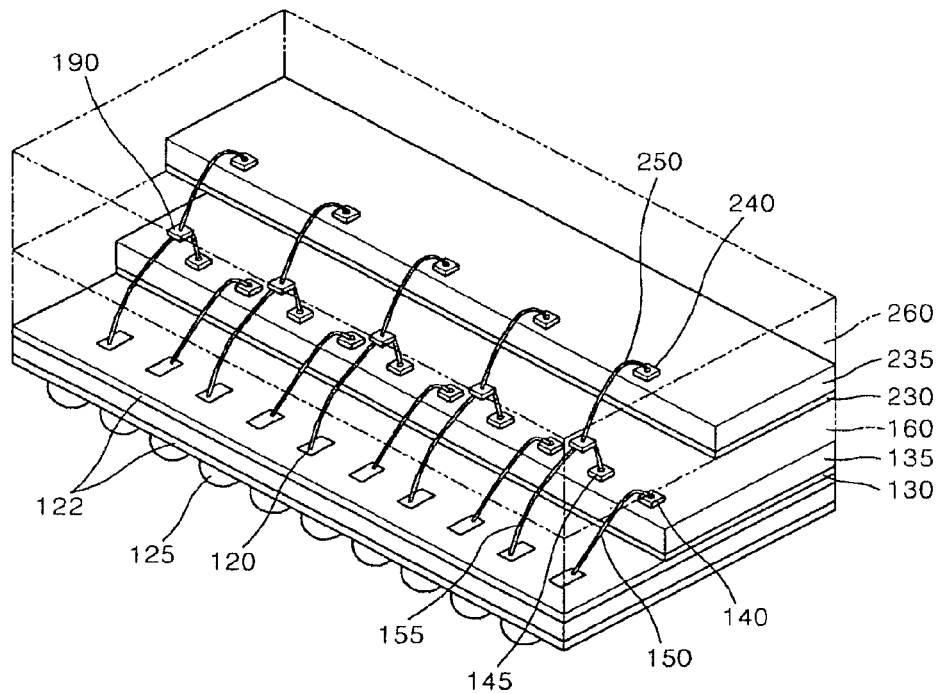

FIGS. 17-18 illustrate a stacked package according to an ninth embodiment of the present invention. As shown in FIGS. 17-18, this ninth embodiment is similar to the first embodiment of FIGS. 1 and 2. For the sake of brevity, those aspects of this ninth embodiment that are the same as the first embodiment will not be described; and instead, the differences from the first embodiment will be described. As shown in FIGS. 17 and 18, connection pads 190 are formed on the first protective layer 160 and each is in contact with an exposed portion of a respective dummy bonding wire 155. The bonding wires 250 connect the bonding pads 240 to a respective connection pad 190. The connection pads 190 may include aluminum, copper, gold, etc.

Figure 19:
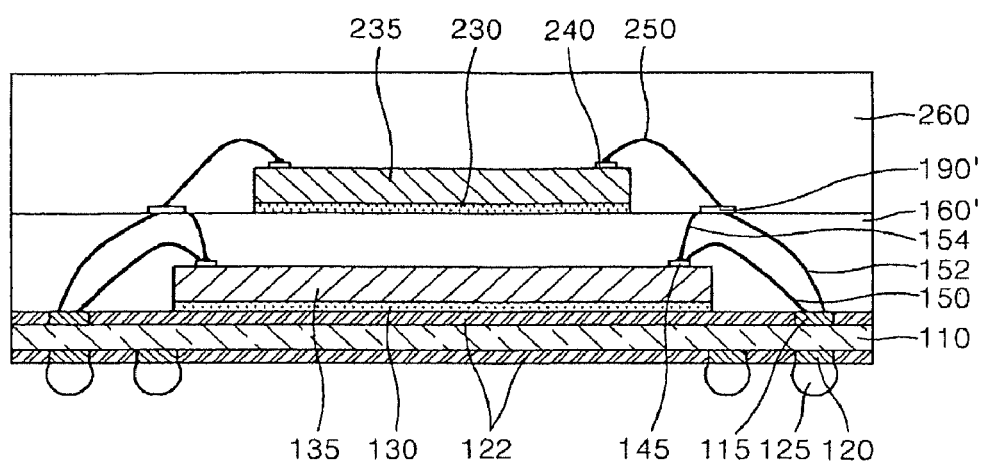
FIGS. 19-20 illustrate a stacked package according to a tenth embodiment of the present invention.
Figure 20:
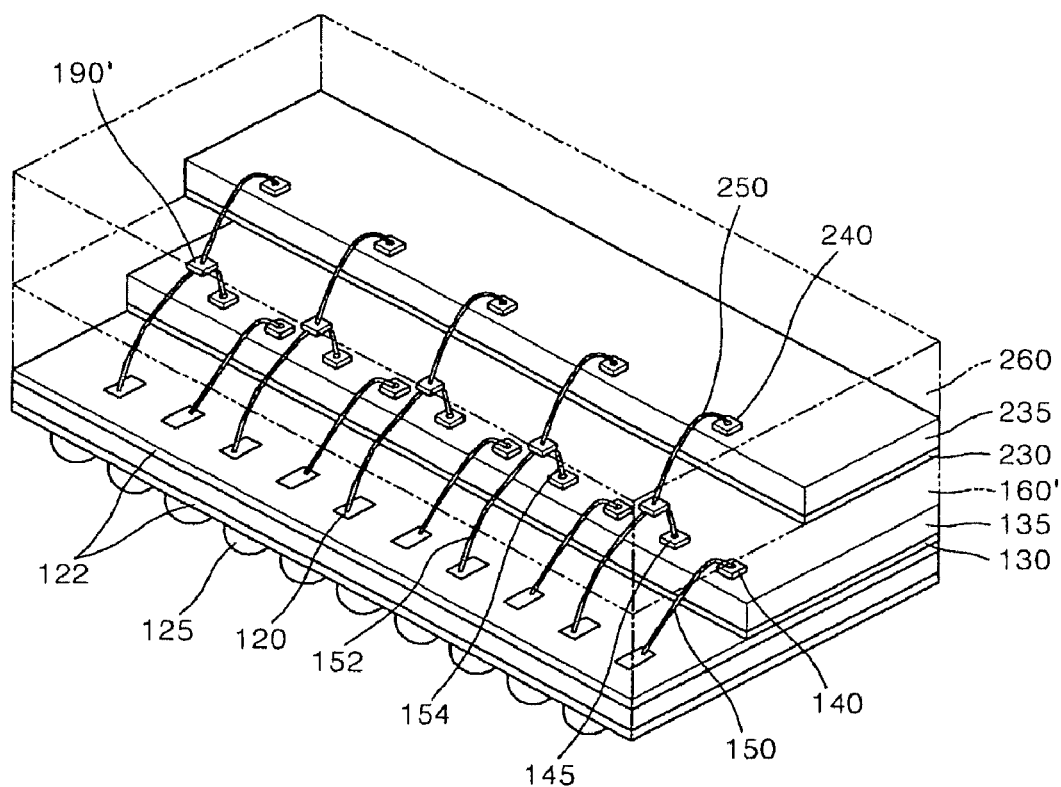

FIGS. 19-20 illustrate a stacked package according to a tenth embodiment of the present invention. As shown in FIGS. 19-20, this tenth embodiment is similar to the embodiment of FIGS. 11 and 12. For the sake of brevity, those aspects of this tenth embodiment that are the same as the embodiment of FIGS. 11 and 12 will not be described; and instead, the differences from the embodiment of FIGS. 11 and 12 will be described. As shown in FIGS. 19 and 20, connection pads 190' are formed on the protective layer 160' and each is in contact with an exposed portion of a respective first part 152. The bonding wires 250 connect the bonding pads 240 to a respective connection pad 190'. The connection pads 190' may include aluminum, copper, gold, etc.

Figure 21:
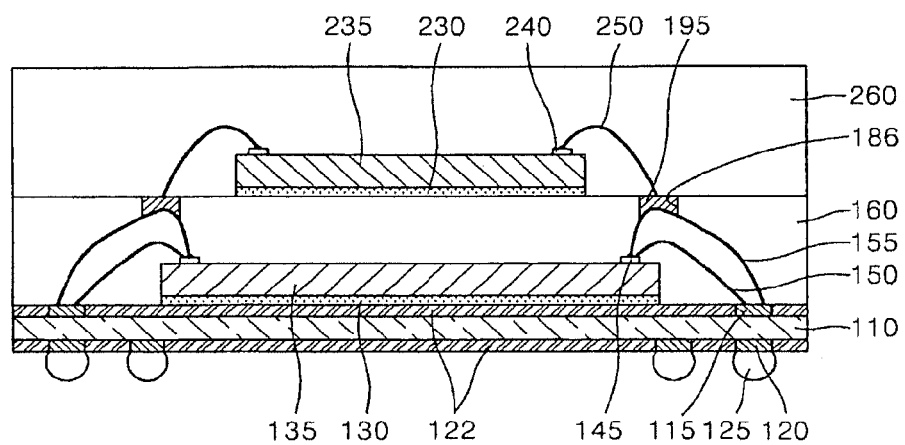
FIGS. 21-22 illustrate a stacked package according to an eleventh embodiment of the present invention.
Figure 22:
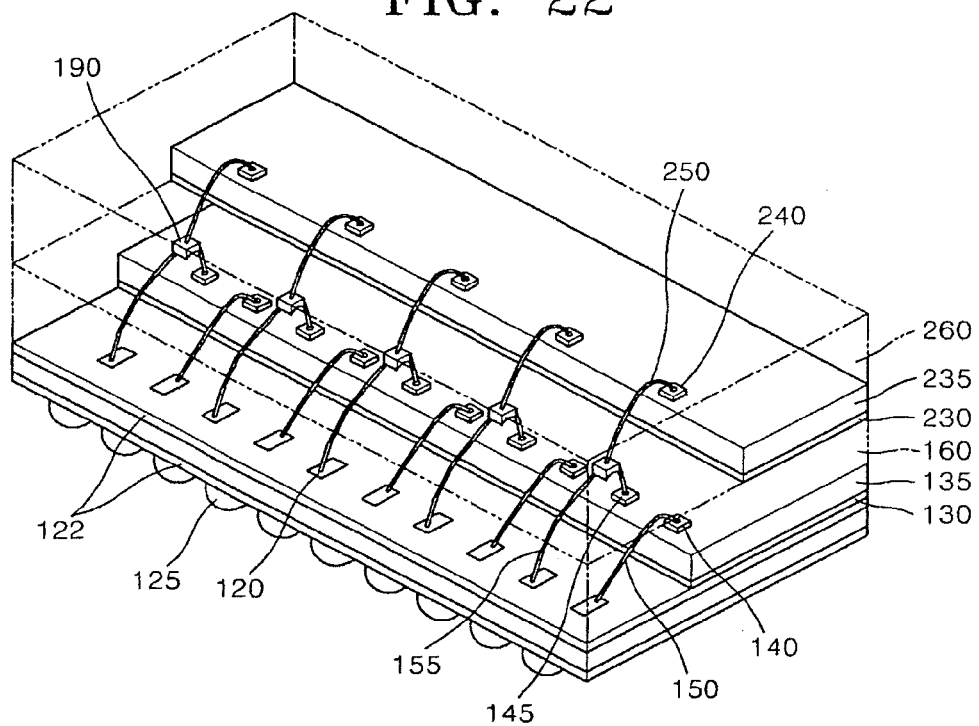

FIGS. 21-22 illustrate a stacked package according to an eleventh embodiment of the present invention. As shown in FIGS. 21-22, this eleventh embodiment is similar to the first embodiment of FIGS. 1 and 2. For the sake of brevity, those aspects of this ninth embodiment that are the same as the first embodiment will not be described; and instead, the differences from the first embodiment will be described. As shown in FIGS. 21 and 22, contact holes 186 are formed in the first protective layer 160 to expose respective dummy bonding wires 155. Connection pads 195 are formed in the contact holes 186, and each connection pad 195 is in contact with a respective exposed dummy bonding wire 155. The bonding wires 250 connect the bonding pads 240 to a respective connection pad 195. The connection pads 195 may include aluminum, copper, gold, etc.

Figure 23:
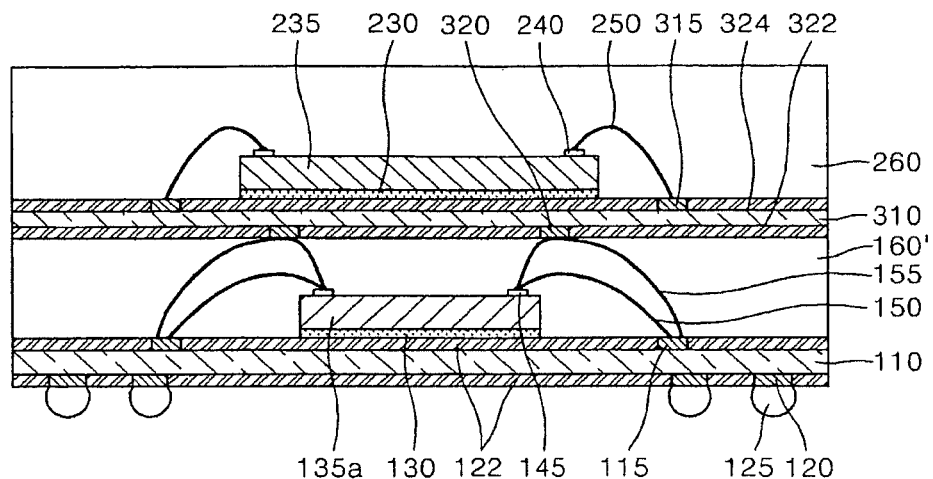
FIG. 23 illustrates a stacked package according to a twelfth embodiment of the present invention.

FIG. 23 illustrates a stacked package according to a twelfth embodiment of the present invention. As shown in FIG. 23, this twelfth embodiment is similar to the first embodiment of FIGS. 1 and 2. For the sake of brevity, those aspects of this twelfth embodiment that are the same as the first embodiment will not be described; and instead, the differences from the first embodiment will be described. As shown in FIGS. 1 and 2, the first chip 135 has a greater area than the second chip 235. However, in this twelfth embodiment, the second chip 235 has a greater area than the first chip 135*a*, and unlike the embodiment of FIG. 8, the dummy bonding wires 155 are not formed by reverse wire bonding.

Instead, an interposer structure 310 is disposed between the first and second chips 135*a* and 235 to provide electrical connection between the second bonding wires 250 and the dummy bonding wires 255. The interposer structure 310 may be a PCB, etc. Lower pads 320 are formed on a first surface 322 of the interposer structure 310. The interposer structure 310 electrically connects at least a portion of the lower pads 320 with upper pads 315 formed on a second surface 324 of the interposer structure 310. Solder resist 122 is formed on the first and second surfaces 322 and 324 around the lower pads 320 and upper pads 315, respectively. The solder resist 122 may be an epoxy, silica, etc.

The bonding wires 250 connect the second bonding pads 240 to respective upper pads 315 of the interposer structure 310, and the dummy bonding wires 155 contact respective lower pads 320. Accordingly, the bonding wires 250 are electrically connected to the dummy bonding wires 155 via the interposer structure 310.

Figure 24:
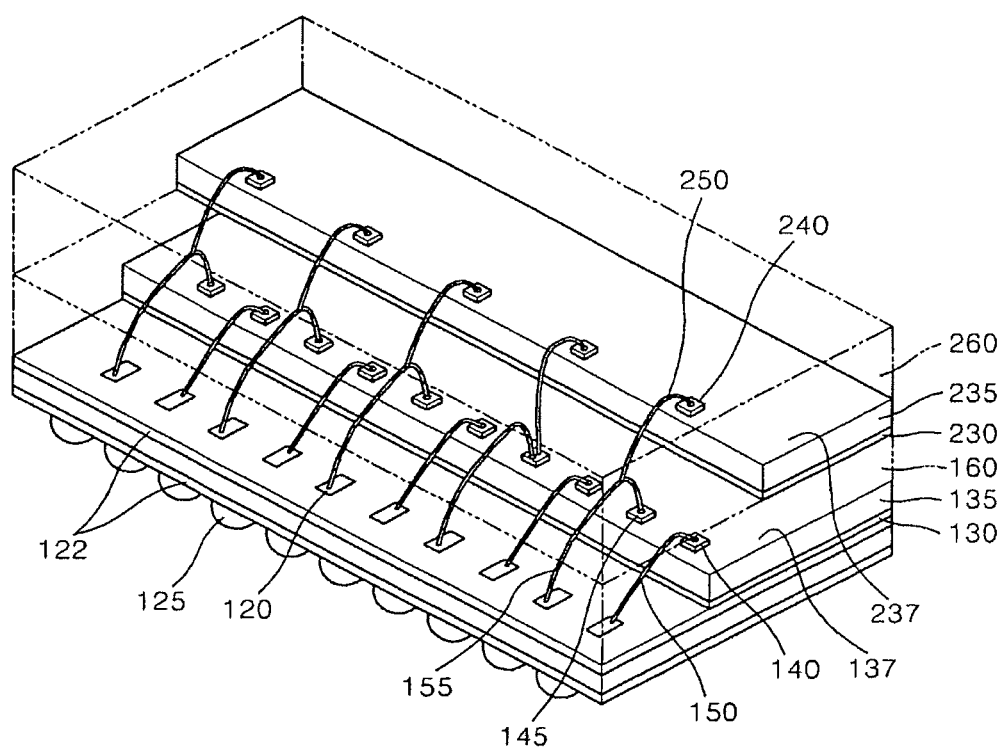
FIG. 24 illustrates an aspect according to an embodiment of the present invention that may be combined with any of the above-described embodiments.

FIG. 24 illustrates an aspect according to an embodiment of the present invention that may be combined with any of the above-described embodiments. As shown, according to this aspect, one or more bonding pads 240 of the second chip 235 may be connected to respective bonding pads 140 of the first chip 135. In particular, FIG. 24 illustrates the application of this embodiment to the embodiment of FIGS. 1 and 2.

Figure 25:
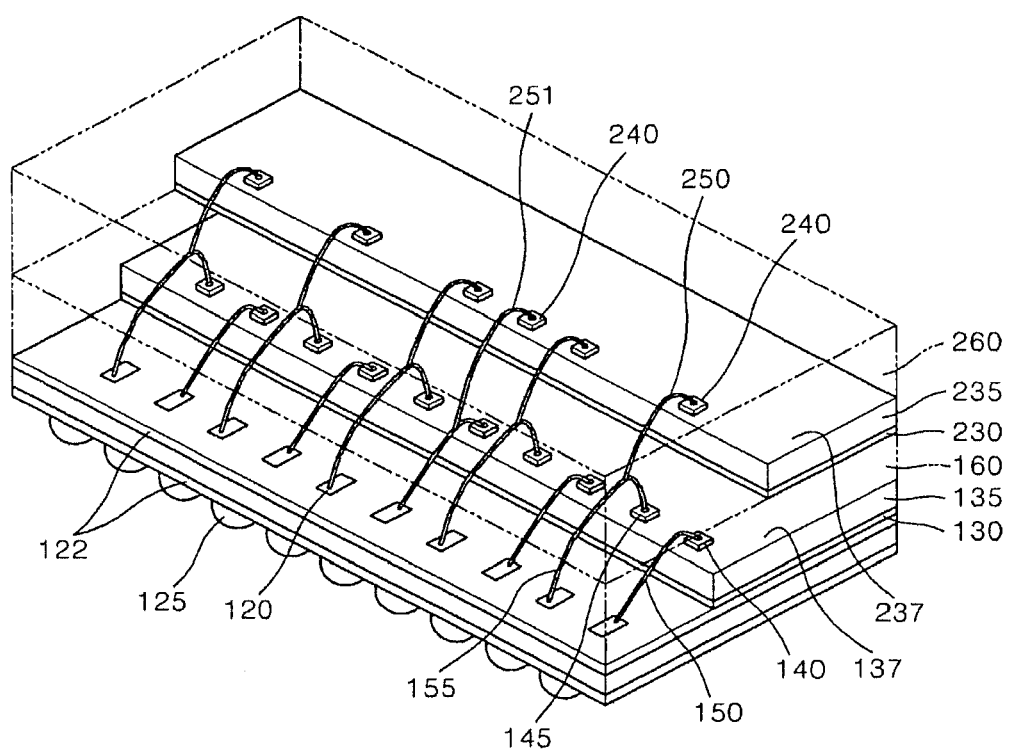
FIG. 25 illustrates another aspect according to an embodiment of the present invention that may be combined with any of the above-described embodiments.

FIG. 25 illustrates another aspect according to an embodiment of the present invention that may be combined with any of the above-described embodiments. As shown, according to this aspect, one or more bonding pads 240 of the second chip 235 may be connected to respective bonding wires 150 by bonding wires 251. Namely, a bonding pad 240 of the second chip 235 may be electrically connected to a bonding pad 140 of the first chip 135 via bonding wires 251 and 150. In particular, FIG. 25 illustrates the application of this embodiment to the embodiment of FIGS. 1 and 2.

Next embodiments of methods for fabricating a stacked package according to the present invention will be described.

FIGS. 26A-26D illustrate a first embodiment of the method for fabricating a stacked package. In particular, this embodiment will be described with respect to the formation of the stacked package described above with respect to FIGS. 1-2.

Figure 26A:
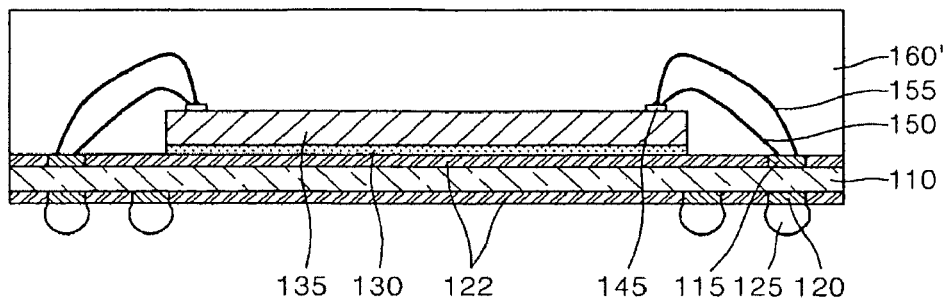
FIGS. 26A-26D illustrate a first embodiment of the method for fabricating a stacked package.

As shown, in FIG. 26A, the adhesive layer 130 is formed on the substrate 110. The substrate 110 is the same as described above with respect to FIGS. 1 and 2; and therefore, a description thereof will not be repeated. The adhesive layer 130 may be an epoxy. As further shown, the first chip 135 is disposed on the adhesive layer 130. As described above with respect to FIGS. 1 and 2, the first chip 135 includes bonding pads 140 and dummy bonding pads 145. Then, using a well-known wire bonding process bonding wires 150 are formed from the bonding pads 140 to the bonding fingers 115, and dummy bonding wires 155 are formed from the dummy bonding pads 145 to the bonding fingers 115.

A protective material 160' is formed over the first chip 135. The protective material 160' may be an epoxy molding compound.

Figure 26B:
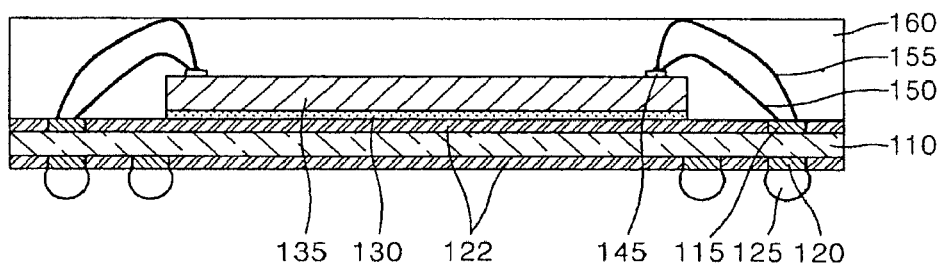

As shown in FIG. 26B, the protective material 160' is removed to expose part of the dummy bonding wires 155 and form the first protective layer 160. The protective material 160' may be removed by chemical mechanical polishing (CMP), etch back, laser drilling, deep etch, etc.

Figure 26C:
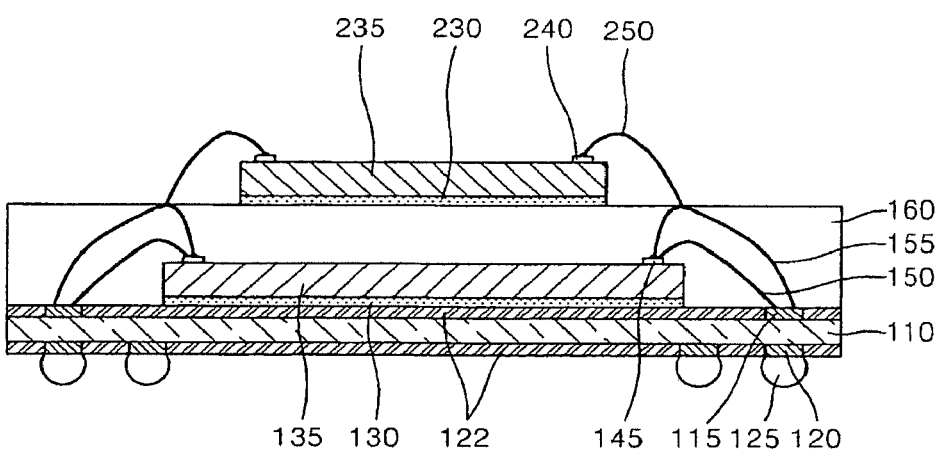
Figure 26D:
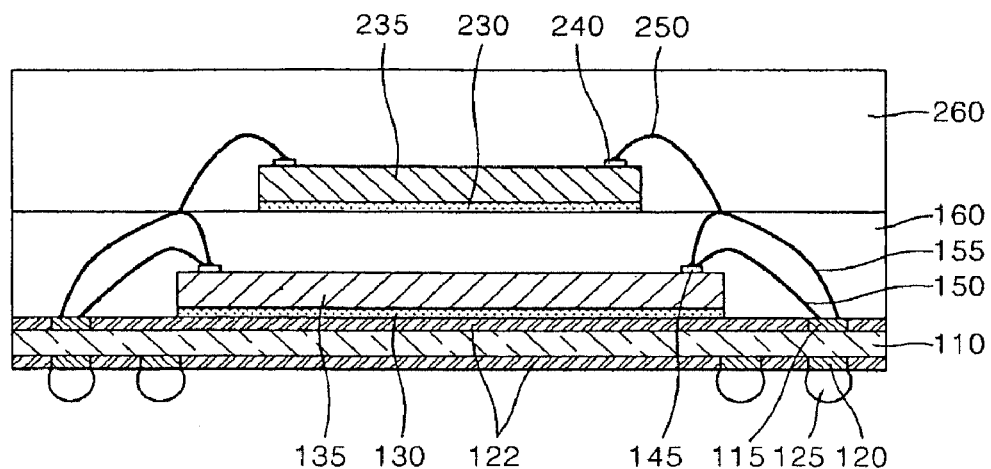

Next, as shown in FIG. 26C, an adhesive layer 230 is formed over the first chip 135 on the first protective layer 160. The adhesive material may be an epoxy. A second chip 235 is disposed on the adhesive layer 230. As described above with respect to FIGS. 1 and 2, the second chip 235 includes the bonding pads 240. Then, using a well-known wire bonding process the bonding wires 250 are formed from the bonding pads 240 to respective exposed portions of the dummy bonding wires 155. As shown in FIG. 26D, the second protective layer 260 is then formed over the second chip 235. The second protective layer 260 may be an epoxy molding compound.

The embodiment described with respect to FIGS. 26A-26D may be applied to the embodiment of FIGS. 3-5. In particular, instead of wire bonding the bonding pads 140 to the substrate 110 as shown in FIG. 26B, the bonding pads 140 on the surface 139 of the first chip 135 in FIG. 3 are wire bonded to bonding pads 117 on the substrate 110.

The embodiment described with respect to FIGS. 26A-26D may be applied to forming the embodiment of FIG. 6 except that instead of wire bonding the bonding pads 140 to the substrate 110 as shown in FIG. 26A, the bonding pads 140 on the first chip 135 in FIG. 6 are electrically connected to the substrate 110 by the TSVs (through silicon vias) 147 as shown in FIG. 6.

The embodiment described with respect to FIGS. 26A-26D may be applied to the embodiment of FIG. 8, except that the dummy bonding wires 155*a* are formed by any well-known reverse bonding technique from the bonding fingers 115 to the dummy bonding pads 145.

The embodiment described with respect to FIGS. 26A-26D may be applied to the embodiment of FIGS. 9-10 except that the first chip 135 includes bonding pads 140 on one side and dummy bonding pads 145 on an opposite side.

Figure 27A:
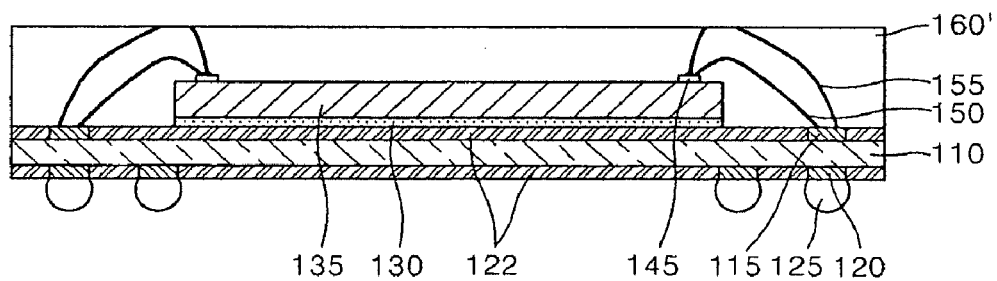
FIG. 27A illustrates another embodiment of a method for fabricating a stacked package.
Figure 27B:
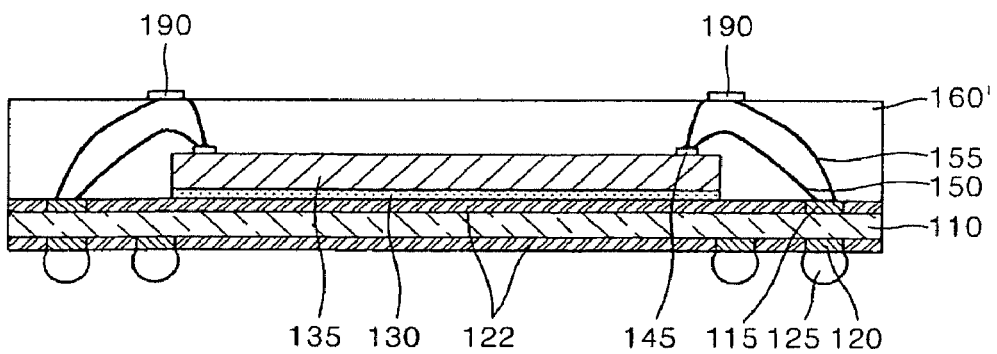
FIG. 27B illustrates yet another embodiment of a method for fabricating a stacked package.

The embodiment described with respect to FIGS. 26A-26D may be applied to the embodiment of FIGS. 11-12, except that the protective layer 160' in FIG. 26A is removed to such an extent that the dummy bonding wires 155 are separated into the first and second parts 152 and 154 as shown in FIG. 27A. Furthermore, with respect to the process steps of FIG. 26C, the bonding wires 250 are formed from the bonding pads 240 to respective exposed portions of the first parts 152 (see FIGS. 11 and 12). In a further alternative, connection pads 190' may be formed on respective exposed portions of the first parts 152 as shown in FIG. 27B using any well-known technique. Then, the process steps of FIGS. 26C and 26D are performed except that the bonding pads 240 are wire bonded to the connection pads 190' as shown in FIG. 19.

The embodiment described with respect to FIGS. 26A-26D may be applied to the embodiment of FIGS. 13-14. Here, the third chip 335 is formed on and wire bonded to the substrate 110 in the same manner as described above with respect to the first chip 135, albeit as shown in FIG. 13. Furthermore, the bonding pads 240 on the side 233 of the second chip 235 are wire bonded to the dummy bonding wires 355 of the third chip 335 in the same manner as described above with respect to the wire bonding of the bonding pads 240 on the side 231 with respect to the dummy bonding wires 155 of the first chip 135, albeit as shown in FIG. 13.

Figure 28:
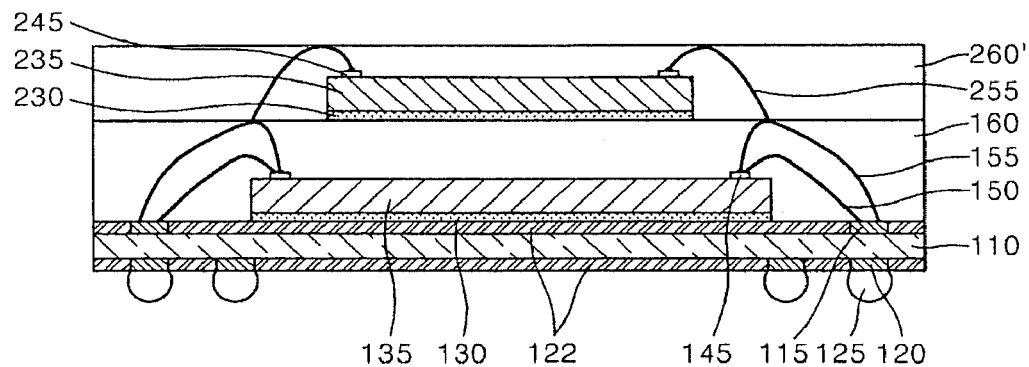
FIGS. 28-29 illustrate a further embodiment of a method for fabricating a stacked package.

In yet another embodiment of the method, the process steps of FIGS. 26A-26D are performed. However, during the process steps of FIG. 26C, dummy bonding pads 245 on the second chip 235 may be wire bonded to respective dummy bonding wires 155, as shown in FIGS. 15 and 16, according to any well-known wire bonding technique to form bonding wires 255. Then, as shown in FIG. 28, the second protective layer 260 is removed to expose part of the dummy bonding wires 255 and form the second protective layer 260'. The second protective layer 260 may be removed by chemical mechanical polishing (CMP), etch back, laser drilling, deep etch, etc.

Figure 29:
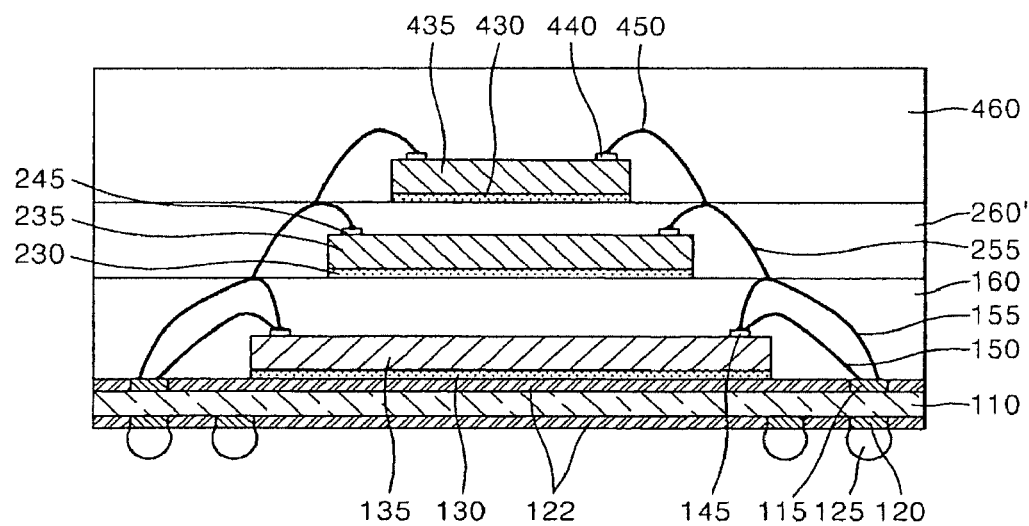

Next, as shown in FIG. 29, an adhesive layer 430 is formed over the second chip 135 on the second protective layer 260'. The adhesive material may be an epoxy. The third chip 435 is disposed on the adhesive layer 430. As described above with respect to FIGS. 1 and 2, the third chip 435 includes the bonding pads 440. Then, using a well-known wire bonding process the bonding wires 450 are formed from the bonding pads 440 to respective exposed portions of the dummy bonding wires 255. As shown in FIG. 29, the third protective layer 460 is then formed over the third chip 435. The third protective layer 460 may be an epoxy molding compound.

Figure 30:
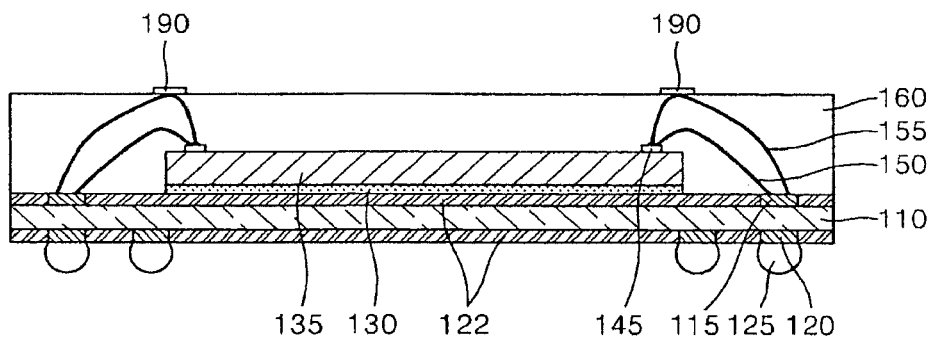
FIG. 30 illustrates an additional embodiment of a method for fabricating a stacked package.

The embodiment described with respect to FIGS. 26A-26D may be applied to the embodiment of FIGS. 17-18, except that after the process steps of FIG. 26B, the connection pads 190 are formed on respective exposed portions of the dummy bonding wires 155 as shown in FIG. 30 using any well-known technique. Then, the process steps of FIGS. 26C and 26D are performed except that the bonding pads 240 are wire bonded to the connection pads 190 as shown in FIG. 17.

Figure 31:
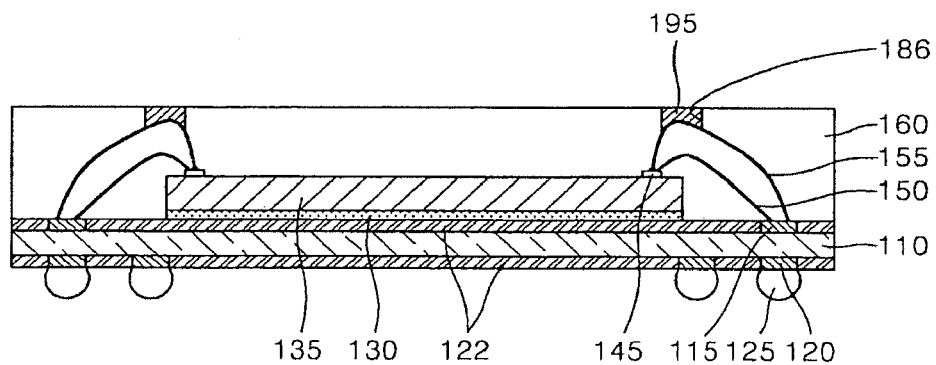
FIG. 31 illustrates another embodiment of a method for fabricating a stacked package.

In another embodiment, after performing the processing steps of FIG. 26A, the first protective layer 160 is etched to form contact holes 186 and expose the dummy bonding wires 155 as shown in FIG. 31. The etching may be performed by laser drilling, deep etching, etc.

Then, the contact holes 186 are filled with a conductive material including, for example, aluminum, copper, gold, etc. to form the connection pads 195. The process steps of FIGS. 26C and 26D are then performed, except that the bonding pads 240 are wire bonded to the connection pads 195 as shown in FIG. 21.

Figure 32:
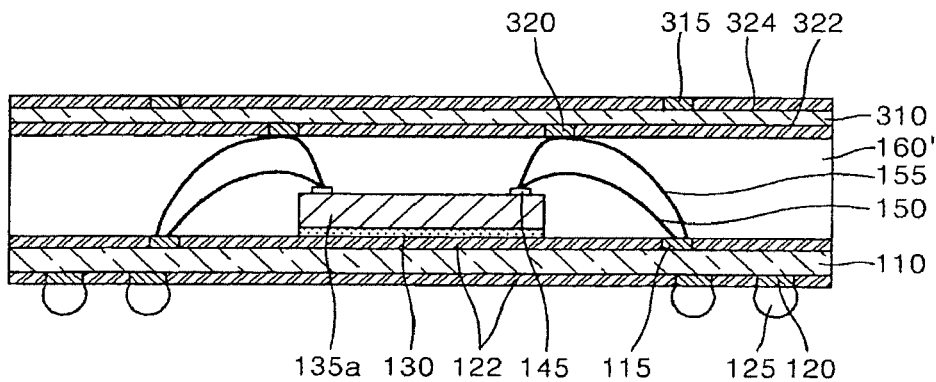
FIG. 32 illustrates yet another embodiment of a method for fabricating a stacked package.

In a still further embodiment, the process steps of FIGS. 26A and 26B are performed. Then, as shown in FIG. 32, the interposer structure 310 is disposed on the first protective layer 160 such that the lower pads 320 contact respective expose portions of the dummy bonding wires 155. Next, as shown in FIG. 23, the adhesive layer 230 is formed over the first chip 135 on the interposer structure 310. The adhesive material may be an epoxy. The second chip 235 is disposed on the adhesive layer 230. As described above with respect to FIGS. 1 and 2, the second chip 235 includes the bonding pads 240. Then, using a well-known wire bonding technique the bonding wires 250 are formed from the bonding pads 240 to respective upper pads 315. The second protective layer 260 is then formed over the second chip 235. The second protective layer 260 may be an epoxy molding compound.

The process steps to form the structures according to the embodiments of FIGS. 24 and 25 will be readily apparent from the above description.

Figure 33:
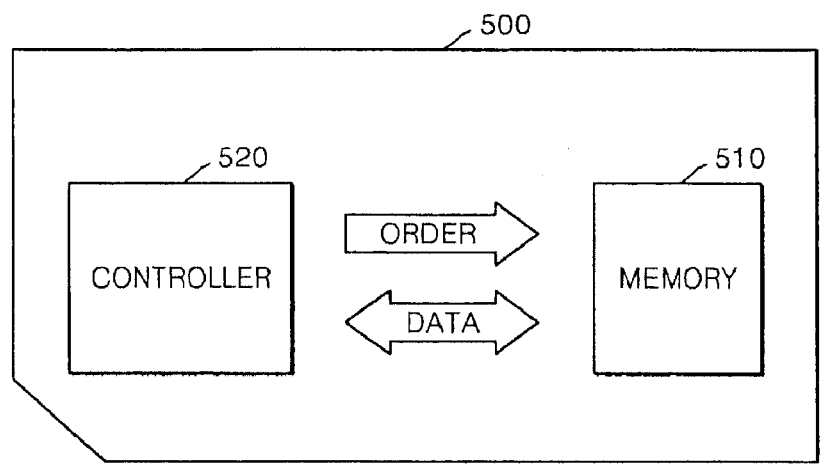
FIG. 33 illustrates a card employing a stacked package according to the present invention.

The stacked packages and methods of manufacturing stack packages may form a variety of devices and have a variety of device applications. FIG. 33 illustrates a card employing a stacked package according to the present invention. The card 500 may be a memory card such as a flash memory card. Namely, the card 500 may be a card meeting any industry standard for use with a consumer electronics device such as a digital camera, personal computer, etc. As shown, this embodiment includes a memory 510 connected to a memory controller 520. The memory 510 may be the NAND flash memory or NOR flash memory, and the memory 510 may be embodied as a stacked package according to any of the above-described embodiments. However, the memory 510 is not limited to these memory architectures, and may be any memory architecture having memory cells formed according to an embodiment of the present invention. The memory controller 520 supplies the input signals for controlling operation of the memory 510. It will be appreciated that the memory controller 520 may control the memory 510 based on controls signals received by the card 500 from another (e.g., external) device.

Figure 34:
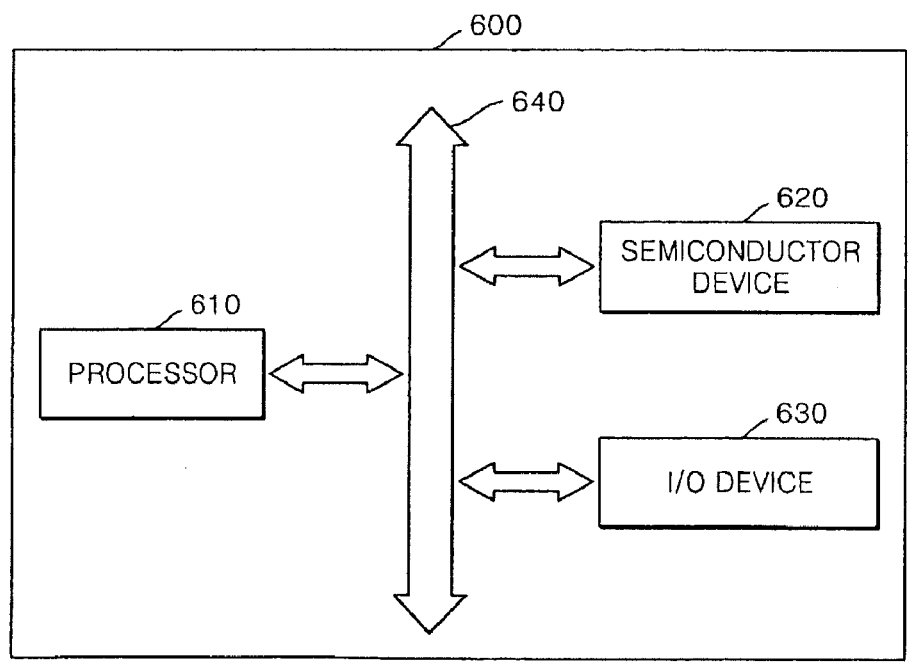
FIG. 34 illustrates application of the stacked package to a system.

FIG. 34 illustrates application of the stacked package to a system. As shown, a semiconductor device 620, such as a memory, may be connected to a central processing unit (CPU) 610 within a computer system 600. For example, the system 600 may be a personal computer, personal data assistant, etc. The semiconductor device 620 may be directly connected with the CPU 610, or connected via bus 640 as shown. It will be appreciated, that FIG. 34 does not illustrate the full complement of components that may be included within a system 600 for the sake of clarity. The semiconductor device 610 may be embodied as a stacked package according to any of the above-described embodiments.

The CPU 610 may receive data and/or output data via an input/output device or interface 630. The interface 630 may conform to a known standard (e.g., firewire, USB, etc.). The interface 630 may also include more than one interface. For example, interface 630 may include a firewire interface, a USB interface, etc. The semiconductor device 620 may also receive and/or output data via the interface 630.

The invention being thus described, it will be obvious that the same may be varied in many ways. Such variations are not to be regarded as a departure from the invention, and all such modifications are intended to be included within the scope of the invention.

We claim:

1. A method of fabricating a stacked package, comprising:
   disposing a first chip over a package substrate, the first chip having at least one first chip dummy pad, the first chip dummy pad not being electrically connected to circuits of the first chip;
   forming a first dummy bonding wire connected to the first chip dummy pad and the package substrate;
   disposing a second chip over at least a portion of the first chip, the second chip having at least one second chip bonding pad;
   forming a first bonding wire electrically connected to the second chip bonding pad and the first dummy bonding wire.

2. The method of claim 1, before the disposing a second chip, further comprising:
   forming a first protective layer over the first chip;
   removing the first protective layer until at least a portion of the first dummy bonding wire is exposed; and wherein
   the forming a first bonding wire electrically connects the first bonding wire to the exposed portion of the first dummy bonding wire.

3. The method of claim 2, wherein the first protective layer is epoxy.

4. The method of claim 2, further comprising:
   forming a connection pad on the exposed portion of the first dummy bonding wire; and wherein
   the forming a first bonding wire electrically connects the first bonding wire to the connection pad.

5. The method of claim 2, further comprising:
   forming a second protective layer over the second chip.

6. The method of claim 1, before the disposing a second chip, further comprising:
   forming a first protective layer over the first chip;
   forming a recess in the first protective layer to expose at least a portion of the first dummy bonding wire;
   filling at least a portion of the recess with a connection pad; and wherein
   the forming a first bonding wire electrically connects the first bonding wire to the connection pad.

7. The method of claim 6, further comprising:
   forming a second protective layer over the second chip.

8. The method of claim 1, before the disposing a second chip, further comprising:
   forming a first protective layer over the first chip;
   removing the first protective layer until the first dummy bonding wire is separated into a first part and a second part, the first part connected to the first chip dummy pad and the second part connected to the package substrate; and wherein
   the forming a first bonding wire electrically connects the first bonding wire to the second part.

9. The method of claim 8, further comprising:
   forming a connection pad on the first protective layer and in contact with the second part; and wherein
   the forming a first bonding wire electrically connects the first bonding wire to the connection pad.

10. The method of claim 8, further comprising:
    forming a second protective layer over the second chip.

11. The method of claim 1, wherein the first dummy bonding wire is formed by reverse wire bonding.

12. The method of claim 11, wherein the second chip has an area greater than the first chip.

13. The method of claim 1, further comprising:
    forming a first adhesive layer over the package substrate; and wherein
    the first chip is disposed on the first adhesive layer.

14. The method of claim 13, further comprising:
    forming a first protective layer over the first chip;
    forming a second adhesive layer on the first protective layer; and wherein
    the second chip is disposed on the second adhesive layer.

* * * * *